United States Patent
Archer et al.

(10) Patent No.: US 9,070,764 B2
(45) Date of Patent: Jun. 30, 2015

(54) EPITAXIAL LIFT OFF STACK HAVING A PRE-CURVED HANDLE AND METHODS THEREOF

(75) Inventors: Melissa Archer, Mountain View, CA (US); Harry Atwater, South Pasadena, CA (US); Thomas Gmitter, Sunnyvale, CA (US); Gang He, Cupertino, CA (US); Andreas Hegedus, Burlingame, CA (US); Gregg Higashi, San Jose, CA (US); Stewart Sonnenfeldt, Burlingame, CA (US)

(73) Assignee: Alta Devices, Inc., Santa Clara, CA (US)

( * ) Notice: Subject to any disclaimer, the term of this patent is extended or adjusted under 35 U.S.C. 154(b) by 0 days.

(21) Appl. No.: 12/475,406

(22) Filed: May 29, 2009

(65) Prior Publication Data

US 2009/0321881 A1    Dec. 31, 2009

Related U.S. Application Data

(60) Provisional application No. 61/057,784, filed on May 30, 2008, provisional application No. 61/104,286, filed on Oct. 10, 2008.

(51) Int. Cl.
*H01L 21/78*    (2006.01)
*H01L 21/683*    (2006.01)

(52) U.S. Cl.
CPC ........ *H01L 21/7813* (2013.01); *H01L 21/6835* (2013.01); *H01L 21/7806* (2013.01); *H01L 2221/6835* (2013.01); *H01L 2221/68381* (2013.01)

(58) Field of Classification Search
CPC .................................................. H01L 21/7813
USPC ................... 257/E21.601; 438/458, 457, 739
See application file for complete search history.

(56) References Cited

U.S. PATENT DOCUMENTS

| | | | |
|---|---|---|---|
| 3,993,533 A | 11/1976 | Milnes et al. | |
| 4,445,965 A | 5/1984 | Milnes | |
| 4,727,047 A | 2/1988 | Bozler et al. | |

(Continued)

FOREIGN PATENT DOCUMENTS

| | | | |
|---|---|---|---|
| WO | WO-2006131316 A1 | 12/2006 | |
| WO | WO-2007089886 A2 | 8/2007 | |

OTHER PUBLICATIONS

PCT International Search Report and Written Opinion dated Apr. 29, 2010 for International Application No. PCT/US2009/060382.

(Continued)

*Primary Examiner* — Daniel Luke

(57) ABSTRACT

Embodiments of the invention generally relate to epitaxial lift off (ELO) thin films and devices and methods used to form such films and devices. In one embodiment, a method for forming an ELO thin film is provided which includes depositing an epitaxial material over a sacrificial layer on a substrate, adhering a flattened, pre-curved support handle onto the epitaxial material, and removing the sacrificial layer during an etching process. The etching process includes bending the pre-curved support handle to have substantial curvature while peeling the epitaxial material from the substrate and forming an etch crevice therebetween. Compression is maintained within the epitaxial material during the etching process. The flattened, pre-curved support handle may be formed by flattening a pre-curved support material.

8 Claims, 7 Drawing Sheets

(56) References Cited

U.S. PATENT DOCUMENTS

| | | | |
|---|---|---|---|
| 4,846,931 A | 7/1989 | Gmitter et al. |
| 4,883,561 A | 11/1989 | Gmitter et al. |
| 5,073,230 A | 12/1991 | Maracas et al. |
| 5,122,852 A | 6/1992 | Chang et al. |
| 5,201,996 A | 4/1993 | Gmitter et al. |
| 5,221,637 A | 6/1993 | De Boeck |
| 5,256,562 A | 10/1993 | Vu et al. |
| 5,258,325 A | 11/1993 | Spitzer et al. |
| 5,276,345 A | 1/1994 | Siegel et al. |
| 5,277,749 A | 1/1994 | Griffith et al. |
| 5,286,335 A | 2/1994 | Drabik et al. |
| 5,344,517 A | 9/1994 | Houlding |
| 5,401,983 A | 3/1995 | Jokerst et al. |
| 5,458,694 A | 10/1995 | Nuyen |
| 5,465,009 A | 11/1995 | Drabik et al. |
| 5,476,810 A | 12/1995 | Curran |
| 5,479,043 A | 12/1995 | Nuyen |
| 5,528,719 A | 6/1996 | Yamada |
| 5,546,375 A | 8/1996 | Shimada et al. |
| 5,641,381 A | 6/1997 | Bailey et al. |
| 5,827,751 A | 10/1998 | Nuyen |
| 5,985,742 A | 11/1999 | Henley et al. |
| 6,010,579 A | 1/2000 | Henley et al. |
| 6,071,795 A | 6/2000 | Cheung et al. |
| 6,155,909 A | 12/2000 | Henley et al. |
| 6,214,733 B1 | 4/2001 | Sickmiller |
| 6,221,740 B1 | 4/2001 | Bryan et al. |
| 6,232,136 B1 | 5/2001 | Zavracky et al. |
| 6,263,941 B1 | 7/2001 | Bryan et al. |
| 6,284,631 B1 | 9/2001 | Henley et al. |
| 6,287,891 B1 | 9/2001 | Sayyah |
| 6,290,804 B1 | 9/2001 | Henley et al. |
| 6,291,313 B1 | 9/2001 | Henley et al. |
| 6,294,814 B1 | 9/2001 | Henley et al. |
| 6,346,459 B1 | 2/2002 | Usenko et al. |
| 6,352,909 B1 | 3/2002 | Usenko |
| 6,387,829 B1 | 5/2002 | Usenko et al. |
| 6,391,740 B1 | 5/2002 | Cheung et al. |
| 6,414,783 B2 | 7/2002 | Zavracky et al. |
| 6,458,672 B1 | 10/2002 | Henley et al. |
| 6,486,041 B2 | 11/2002 | Henley et al. |
| 6,500,732 B1 | 12/2002 | Henley et al. |
| 6,504,524 B1 | 1/2003 | Gates et al. |
| 6,511,899 B1 | 1/2003 | Henley et al. |
| 6,513,564 B2 | 2/2003 | Bryan et al. |
| 6,528,391 B1 | 3/2003 | Henley et al. |
| 6,548,382 B1 | 4/2003 | Henley et al. |
| 6,554,046 B1 | 4/2003 | Bryan et al. |
| 6,559,075 B1 | 5/2003 | Kelly et al. |
| 6,573,129 B2 | 6/2003 | Hoke et al. |
| 6,589,811 B2 | 7/2003 | Sayyah |
| 6,632,724 B2 | 10/2003 | Henley et al. |
| 6,666,943 B2 | 12/2003 | Wada et al. |
| 6,669,801 B2 | 12/2003 | Yoshimura et al. |
| 6,677,249 B2 | 1/2004 | Laermer et al. |
| 6,740,604 B2 | 5/2004 | Kelly et al. |
| 6,756,285 B1 * | 6/2004 | Moriceau et al. ............ 438/455 |
| 6,790,747 B2 | 9/2004 | Henley et al. |
| 6,809,044 B1 | 10/2004 | Aspar et al. |
| 6,890,838 B2 | 5/2005 | Henley et al. |
| 6,943,050 B2 | 9/2005 | Kondo |
| 6,974,521 B2 | 12/2005 | Schermer |
| 7,030,032 B2 | 4/2006 | Marsh et al. |
| 7,045,878 B2 | 5/2006 | Faris |
| 7,056,808 B2 | 6/2006 | Henley et al. |
| 7,060,591 B2 | 6/2006 | Yamazaki et al. |
| 7,153,761 B1 | 12/2006 | Nastasi et al. |
| 7,160,790 B2 | 1/2007 | Henley et al. |
| 7,163,826 B2 | 1/2007 | Faris |
| 7,198,671 B2 | 4/2007 | Ueda |
| 7,202,141 B2 | 4/2007 | Park et al. |
| 7,229,901 B2 | 6/2007 | Savage et al. |
| 7,241,667 B2 | 7/2007 | Park et al. |
| 7,341,925 B2 | 3/2008 | Kelly et al. |
| 7,348,258 B2 | 3/2008 | Henley et al. |
| 7,638,410 B2 | 12/2009 | Nastasi et al. |
| 2003/0134488 A1 * | 7/2003 | Yamazaki et al. ............ 438/455 |
| 2005/0020094 A1 | 1/2005 | Forbes et al. |
| 2006/0194360 A1 * | 8/2006 | Takeuchi et al. ............ 438/46 |
| 2006/0292822 A1 | 12/2006 | Xie |
| 2009/0321885 A1 | 12/2009 | Archer et al. |
| 2009/0321886 A1 | 12/2009 | Gmitter et al. |
| 2009/0324379 A1 | 12/2009 | He et al. |
| 2009/0325367 A1 | 12/2009 | He et al. |
| 2010/0001316 A1 | 1/2010 | Gmitter et al. |
| 2010/0001374 A1 | 1/2010 | Gmitter et al. |

OTHER PUBLICATIONS

Bauhuis, G.J., "Substrate Reuse for Epitaxial Lift-Off of III-V Solar Cells", Proceedings of the 22nd European Photovoltaic Solar Energy Conference: Milan, Sep. 3-7, 2007, pp. 106-110.

Bauhuis, G.J., "Thin film GaAs solar cells with increased quantum efficiency due to light reflection", Solar Energy Materials & Solar Cells 83 (2004) 81-90, Nov. 3, 2003.

Konagai, Makoto, "High Efficiency GaAs Thin Film Solar Cells by Peeled Film Technology", Journal of Crystal Growth 45 (1978) 277-280.

Kumar, P., "Sacrificial etching of $Al_xGa_{1-x}As$ for III-V MEMS surface micromachining", Appl. Phys. A 88, 711-714, May 24, 2007.

Schermer J.J., "Epitaxial Lift-Off for large area thin film III/V devices", Phys. Stat. Sol. (1) 202, No. 4, 501-508 (2005).

Schermer, J.J., "Photon confinement in high-efficiency, thin-film III-V solar cells obtained by epitaxial lift-off", Thin Solid Films 511-512 (2006) 645-653, Jan. 19, 2006.

Schermer, J.J., "Thin-film GaAs Epitaxial Lift-Off Solar Cells for Space Applications", Prog. Photovolt: Res. Appl. 2005; 13:587-596, Apr. 28, 2005.

Schermer, John, "Solar Cells Based on III-V Semiconductors", Joint Solar Panel, Sep. 29, 2004.

Sickmiller, Mike, "Packaging of Ultrathin Semiconductor Devices Through The ELO Packaging Process", Mat. Res. Soc. Symp. Proc. vol. 681E (2001).

van Deelen, J. "On the development of high-efficiency thin-film GaAs and GaInP2 cells", Journal of Cyrstal Growth 298 (2007) 772-776, Nov. 28, 2006.

van Niftrik, A. T. J., "HF Species and Dissolved Oxygen on the Epitaxial Lift-Off Process of GaAs Using AlAsP Release Layers", Journal of The Electrochemical Society, 155 (1) D35-D39 (2008), Nov. 6, 2007.

van Niftrik, A.T.J., "A Diffusion and Reaction Related Model of the Epitaxial Lift-Off Process", Journal of The Electrochemical Society, 154 (11) D629-D635 (2007), Sep. 19, 2007.

van Niftrik, Antonius T. J., "The Influence of $In_xGa_{1-x}As$ and $GaAs_{1-y}P_y$ Layers Surrounding the AlAs Release Layer in the Epitaxial Lift-Off Process", Crystal Growth & Design, 2007, vol. 7, No. 12, 2472-2480, Aug. 7, 2007.

Voncken, M.M.A.J., "Strain-accelerated HF etching of AlAs for epitaxial lift-off", J. Phys.: Condens. Matter 16 (2004) 3585-3596, May 14, 2004.

Voncken, M.M.A.J., "Influence of radius of curvature on the lateral etch rate of the weight induced epitaxial lift-off process", Material Science and Engineering B95 (2002) 242-248, May 21, 2002.

Voncken, M.M.A.J., "Multiple release layer study of the intrinsic lateral etch rate of the epitaxial lift-off process", Appl. Phys. A 79, 1801-1807, Mar. 28, 2003.

Yablonovitch, E., "Van De Waals bonding of GaAs epitaxial liftoff films onto arbitrary substrates", Appl. Phys. Lett. 56 (24), Jun. 11, 1990.

PCT Search Report and Written Opinion for International Application No. PCT/US2009/045715, dated Jan. 4, 2010.

* cited by examiner

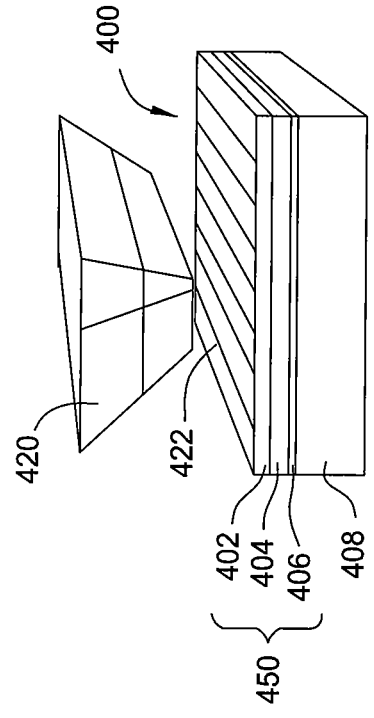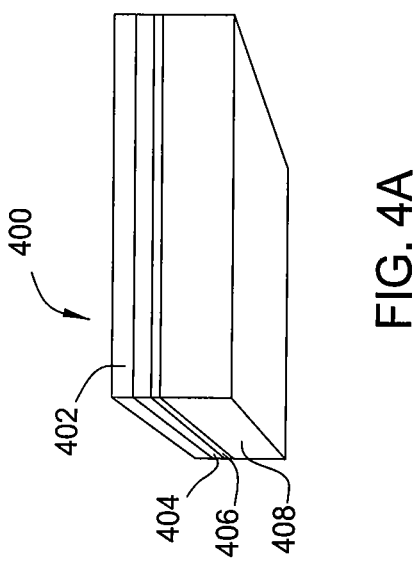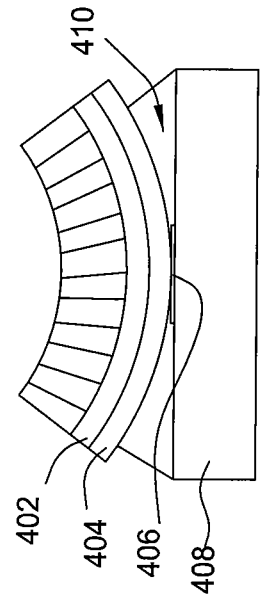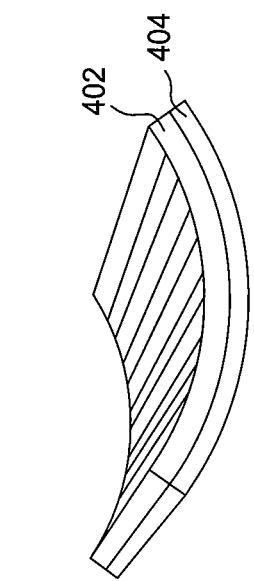
FIG. 4A
FIG. 4B
FIG. 4C
FIG. 4D

EPITAXIAL LIFT OFF STACK HAVING A PRE-CURVED HANDLE AND METHODS THEREOF

CROSS-REFERENCE TO RELATED APPLICATIONS

This application claims benefit of U.S. Ser. No. 61/057,784, filed May 30, 2008, and U.S. Ser. No. 61/104,286, filed Oct. 10, 2008, which are incorporated herein by reference in their entirety.

BACKGROUND OF THE INVENTION

1. Field of the Invention

Embodiments of the invention generally relate to the fabrication of solar, semiconductor, and electronic devices, and more particularly to epitaxial lift off (ELO) devices and methods.

2. Description of the Related Art

One phase in device fabrication involves handling and packaging of thin films used as solar devices, semiconductor devices, or other electronic devices. Such thin film devices may be manufactured by utilizing a variety of processes for depositing and removing materials onto a wafer or other substrate. One uncommon technique for manufacturing thin film devices is known as the epitaxial lift off (ELO) process. The ELO process includes depositing an epitaxial layer or film on a sacrificial layer on a growth substrate, then etching the sacrificial layer to separate the epitaxial layer from the growth substrate. The thin epitaxial layer removed is known as the ELO film or layer and typically includes thin films used as solar devices, semiconductor devices, or other electronic devices.

The thin ELO films are very difficult to manage or handle, such as when bonding to a substrate or while packaging, since the ELO films are very fragile and have narrow dimensions. The ELO films crack under very small forces. Also, the ELO films are very difficult to align due to their extremely narrow dimensions.

The sacrificial layer is typically very thin and is usually etched away via a wet chemical process. The speed of the overall process may be limited by the lack of delivery or exposure of reactant to the etch front, which leads to less removal of by products from the etch front. This described process is a diffusion limited process and if the films were maintained in their as deposited geometries, a very narrow and long opening would form to severely limit the overall speed of the process. To lessen the transport constraint of the diffusion processes, it may be beneficial to open up the resulting gap created by the etched or removed sacrificial layer and bending the epitaxial layer away from the growth substrate. A crevice is formed between the epitaxial layer and the growth substrate-which geometry provides greater transport of species both towards and away the etch front. Reactants move towards the etch front while by-products generally move away from the etch front.

The bending of the epitaxial layer however can induce stresses there within and the amount of bending is limited by the strength of the film. The epitaxial layer usually contains a brittle material, which does not undergo plastic deformation before failure, and as such may be subject to crack induced failures.

To minimize the potential for crack propagation, the brittle epitaxial layer may be maintained under a compressive stress. Cracks usually do not propagate through regions of residual compressive stress. The epitaxial layer is placed under tensile stress while bending the epitaxial layer away from the growth substrate since the epitaxial layer is on the outside of the curvature of the crevice. The tensile stress limits the amount of crevice curvature and reduces the speed of the etch process. To overcome this limitation, a residual compressive stress may be instilled within the epitaxial layer before etching the sacrificial layer. This initial compressive stress may be offset by tensile stress caused by the bending and therefore allows for a greater amount bending during the separation process.

Therefore, there is a need for more robust ELO thin films, as well as for methods to form, remove, and handle ELO thin films.

SUMMARY OF THE INVENTION

Embodiments of the invention generally relate to epitaxial lift off (ELO) thin films and devices and methods used to form such films and devices. The ELO thin films generally contain epitaxially grown layers which are formed on a sacrificial layer disposed on or over a substrate, such as a wafer. A support material or support handle may be disposed on the opposite side of the epitaxial material than the substrate. The support handle may be used to stabilize the epitaxial material, such as by providing compression to the epitaxial material. Furthermore, the support handle may be used to grip and hold the epitaxial material during the etching and removal steps of the ELO process. In various embodiments, the support material or support handle may include a pre-curved handle, a multi-layered handle, a non-uniform wax handle, and two shrinkage-induced handles which universally or unidirectional shrink to provide compression to the epitaxial material.

In one embodiment, a method for forming a thin film material during an ELO process is provided which includes forming an epitaxial material on or over a sacrificial layer, which is disposed on or over on a substrate, adhering a multi-layered support handle onto the epitaxial material, removing the sacrificial layer during an etching process, and peeling the epitaxial material from the substrate while forming an etch crevice therebetween while maintaining compression in the epitaxial material during the etching process. The method further provides that the multi-layered support handle contains a stiff support layer disposed on or over or adhered to the epitaxial material, a soft support layer adhered to the stiff support layer, and a handle plate adhered to the soft support layer.

In one example, the multi-layered support handle contains a stiff support layer disposed over the epitaxial material, a soft support layer disposed over the stiff support layer, and a handle plate disposed over the soft support layer. The multi-layered support handle is disposed on and maintains compression of the epitaxial material. In some embodiments, the stiff support layer may contain a polymer, a copolymer, an oligomer, derivatives thereof, or combinations thereof. In one example, the stiff support layer contains a copolymer, such as an ethylene/vinylacetate (EVA) copolymer or a derivative thereof. In other examples, the stiff support layer may contain a hot-melt adhesive, an organic material or organic coating, an inorganic material, or combinations thereof. In one example, the inorganic material contains multiple inorganic layers, such as metal layers and/or dielectric layers. In another example, the stiff support layer may contain composite materials or patterned composite materials, such as organic/inorganic materials. The composite materials may contain at least one organic material and at least one inorganic material. In some examples, the inorganic material may contain a metal layer, a dielectric layer, or combinations thereof.

In another example, the stiff support layer may contain wax or derivatives thereof, such as black wax.

In other embodiments, the soft support layer may contain an elastomer, such as rubber, foam, or derivatives thereof. Alternatively, the soft support layer may contain a material such as neoprene, latex, or derivatives thereof. The soft support layer may contain a monomer. For example, the soft support layer may contain an ethylene propylene diene monomer or derivatives thereof. In another embodiment, the soft support layer may contain a liquid or a fluid contained within a membrane. Alternatively, the soft support layer may contain a gas contained within a membrane. The membrane may contain a material such as rubber, foam, neoprene, latex, or derivatives thereof. In one example, the membrane is a balloon, such as a rubber balloon or a latex balloon.

In another embodiment, the handle plate may be made from or contain a plastic material, a polymeric material, or an oligomeric material, derivatives thereof, mixtures thereof, or combinations thereof. In one example, the handle plate may contain polyester or derivatives thereof. The handle plate may have a thickness within a range from about 50.8 µm to about 127.0 µm, such as about 23.4 µm.

In one embodiment, the method further includes removing the epitaxial material from the substrate and attaching a support substrate to an exposed surface of the epitaxial material. The support substrate may be bonded to the exposed surface of the epitaxial material by an adhesive, thereby forming an adhesive layer therebetween. In one example, the adhesive is an optical adhesive and/or may be UV-curable (e.g., cured by ultraviolet light exposure). In some examples, the adhesive may contain a mercapto ester compound. In other examples, the adhesive may further contain a material such as butyl octyl phthalate, tetrahydrofurfuryl methacrylate, acrylate monomer, derivatives thereof, or combinations thereof.

In another embodiment, a thin film material, such as an ELO thin film stack, is provided which includes a support substrate disposed on or over a first surface of the epitaxial material, and a support handle disposed on or over the other surface of the epitaxial material. An adhesive layer may be disposed between the epitaxial material and the support substrate. In one example, the support handle may be a multi-layered support handle which contains the stiff support layer disposed on or over the epitaxial material, the soft support layer disposed on or over the stiff support layer, and the handle plate disposed on or over the soft support layer.

In another embodiment, the ELO thin film stack is provided which includes a sacrificial layer disposed on a substrate, an epitaxial material disposed on or over the sacrificial layer, and a flattened, pre-curved support material or handle disposed on or over the epitaxial material. The flattened, pre-curved support handle is under tension while the epitaxial material is under compression. The flattened, pre-curved support handle may contain a single layer or multiple layers. The flattened, pre-curved support handle may contain wax, polyethylene, polyester, polyolefin, polyethylene terephthalate polyester, rubber, derivatives thereof, or combinations thereof. In some examples, the flattened, pre-curved support handle contains wax. In other examples, the flattened, pre-curved support handle contains polyethylene terephthalate polyester or derivatives thereof. In other examples, the flattened, pre-curved support handle contains polyolefin or derivatives thereof.

In some embodiments, the flattened, pre-curved support handle contains a first layer having wax and a second layer having a polymer disposed over the first layer. For example, the second layer may contain polyethylene terephthalate polyester or derivatives thereof. In other examples, the flattened, pre-curved support handle contains at least three layers. The third layer may contain wax and be disposed on or over the second layer. In some examples, the third layer contains another polymer (e.g., polyethylene or derivatives thereof) and is disposed on or over the second layer. In other embodiments, an adhesive is disposed between the flattened, pre-curved support handle and the epitaxial material.

In other embodiments, a method for forming a thin film material, such as an ELO thin film stack, during an ELO process, is provided which includes forming an epitaxial material on or over a sacrificial layer on a substrate, adhering a flattened, pre-curved support material or handle onto or over the epitaxial material, removing the sacrificial layer during an etching process, and peeling the epitaxial material from the substrate while forming an etch crevice therebetween and bending the flattened, pre-curved support handle to have substantial curvature. The flattened support handle is under tension to put the epitaxial material under compression. The flattened support handle may be formed by flattening a curved support material.

In another embodiment, the ELO thin film stack is provided which includes a sacrificial layer disposed on or over a substrate, an epitaxial material disposed on or over the sacrificial layer, and a universal shrinkable support handle disposed on or over the epitaxial material, wherein the support handle contains a universal shrinkable material, which upon being shrunk, forms tension in the support handle and compression in the epitaxial material. In one example, the universal shrinkable material contains an amorphous material. The amorphous material may be crystallized to undergo a net volume reduction during a universal shrinking process. The universal shrinkable material may contain a plastic, a polymer, an oligomer, derivatives thereof, mixtures thereof, or combinations thereof. In some examples, the universal shrinkable support handle contains a heat shrink polymer.

In another embodiment, a method for forming the ELO thin film stack during an ELO process, is provided which includes forming an epitaxial material on or over a sacrificial layer, which is disposed on or over a substrate, adhering a universal shrinkable support handle onto or over the epitaxial material, wherein the support handle contains a universal shrinkable material, shrinking the support handle to form tension in the support handle and compression in the epitaxial material during a universal shrinking process, removing the sacrificial layer during an etching process, and peeling the epitaxial material from the substrate while forming an etch crevice therebetween and bending the support handle to have substantial curvature. The universal shrinkage support handle may contain one layer or multiple layers.

In another embodiment, a thin film stack material is provided which includes a sacrificial layer disposed on or over a substrate, an epitaxial material disposed on or over the sacrificial layer, and a unidirectional shrinkable support handle disposed on or over the epitaxial material. The unidirectional shrinkable support handle may contain a shrinkable material and reinforcement fibers extending unidirectional throughout the shrinkable material. The shrinkable material shrinks unidirectional and tangential to the reinforcement fibers to form tension in the support handle and compression in the epitaxial material.

The reinforcement fibers are high-strength polymeric fibers. In one example, the reinforcement fibers contain polyethylene or derivatives thereof. In some examples, the reinforcement fibers contain a negative linear thermal expansion coefficient along the length of the fiber. Generally, the reinforcement fibers have a tensile moduli within a range from about 15 GPa to about 134 GPa.

In other embodiments, a method for forming a thin film material during an ELO process is provided which includes forming an epitaxial material on or over a sacrificial layer on a substrate, adhering a unidirectional shrinkable support handle onto the epitaxial material, wherein the support handle contains a shrinkable material and reinforcement fibers extending unidirectional throughout the shrinkable material, and shrinking the support handle tangential to the reinforcement fibers to form tension in the support handle and compression in the epitaxial material during a unidirectional shrinking process. The method further includes removing the sacrificial layer during an etching process, peeling the epitaxial material from the substrate while forming an etch crevice therebetween, and bending the support handle to have substantial curvature.

In other embodiments, a thin film stack material is provided which includes a sacrificial layer disposed on or over a substrate, an epitaxial material disposed on or over the sacrificial layer, and a non-uniform support handle disposed on or over the epitaxial material, wherein the non-uniform support handle contains a wax film having a varying thickness.

In another embodiment, a method for forming a thin film material during an ELO process, is provided which includes forming an epitaxial material disposed on or over a sacrificial layer on a substrate, and adhering a non-uniform support handle onto or over the epitaxial material, wherein the non-uniform support handle contains a wax film having a varying thickness. The method further includes removing the sacrificial layer during an etching process, peeling the epitaxial material from the substrate while forming an etch crevice therebetween, and bending the non-uniform support handle to form compression in the epitaxial material during the etching process.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 4A-4C depict an ELO thin film stack containing a unidirectional shrinkable support handle according to other embodiments described herein;

FIG. 4D depicts the unidirectional shrinkable handle and the epitaxial material after being removed from the wafer, as described in embodiments herein;

DETAILED DESCRIPTION

Figure 1:
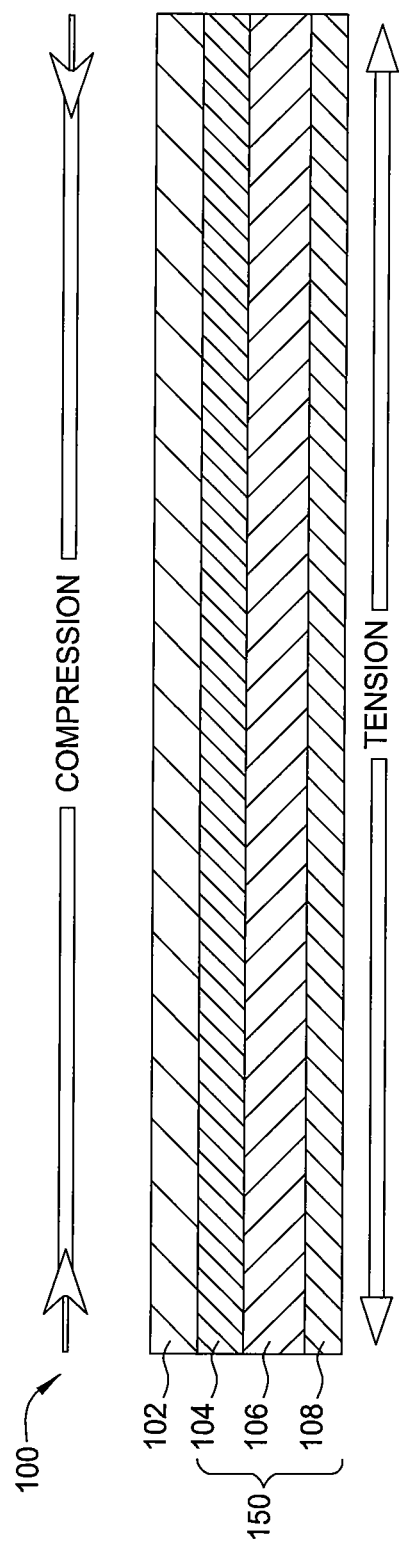
FIG. 1 depicts an ELO thin film stack on a wafer according to embodiments described herein.

FIG. 1 depicts substrate 100 containing ELO thin film stack 150 disposed on wafer 102, as described in one embodiment herein. ELO thin film stack 150 may have sacrificial layer 104 disposed on or over wafer 102, epitaxial material 106 disposed on or over sacrificial layer 104, and support handle 108 disposed on or over epitaxial material 106. In various embodiments, support handle 108 is under tension while the epitaxial material 106 is under compression. The ELO process includes removing sacrificial layer 104 during an etching process, while peeling epitaxial material 106 from wafer 102 and forming an etch crevice therebetween until epitaxial material 106 and support handle 108 are removed from wafer 102. Sacrificial layer 104 generally contains aluminum arsenide.

Wafer 102 may contain or be formed of a variety of materials, such as Group III/V materials, and may be doped with other elements. In one embodiment, wafer 106 contains gallium arsenide or a derivative thereof. A gallium arsenide wafer has thermal expansion coefficient of about $5.73 \times 10^{-6}$ °C.$^{-1}$. In various embodiments, support handle 108 contains materials (e.g., wax or polymers) which have a higher coefficient of thermal expansion.

Support handle 108 may be a single layer of material or multiple layers. In the various embodiments, support handle 108 may be a flattened, pre-curved support handle that is formed by flattening a curved support material. In another embodiment, support handle 108 may contain a shrinkable material, such as a thermally shrinkable plastic. In an alternative embodiment, support handle 108 may contain a shrinkable material having reinforcement fibers extending unidirectional throughout the shrinkable material. In another embodiment, support handle 108 may contain a wax film having a varying or non-uniform thickness across substrate 100. In another embodiment, support handle 108 may be a multi-layered handle.

Pre-Curved Handle

Figure 2B:
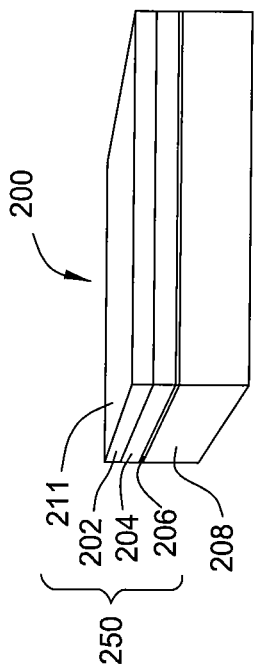
FIGS. 2B-2C depict an ELO thin film stack containing the pre-curved support handle according to embodiments described herein.
Figure 2A:
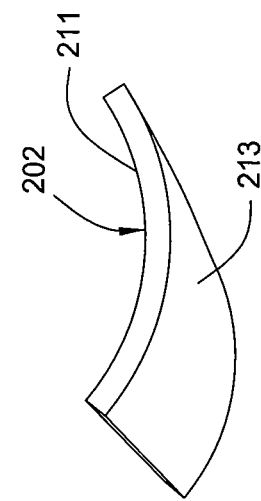
FIG. 2A depicts a pre-curved support handle according to an embodiment described herein.

FIGS. 2A-2D depict a pre-curved support material or handle during various aspects of an ELO process or within an ELO thin film stack, as described in one embodiment herein. FIG. 2A illustrates a pre-curved support material, such as pre-curved support handle 202. Pre-curved support handle 202 contains top surface 211 and bottom surface 213. In one embodiment, pre-curved support handle 202 may be flattened or straightened prior to adhering or attaching to the substrate 200, such as to epitaxial material 204. Alternatively, pre-curved support handle 202 may be flattened or straightened while adhering or attaching to the substrate 200. Once flattened or straightened, pre-curved support handle 202 is under tension, which is utilized to produce compression to the underlying layers (e.g., epitaxial material 204) when adhered or attached to the substrate 200.

Figure 2C:
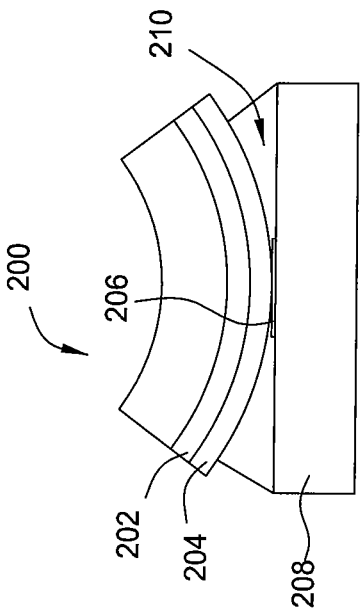

FIG. 2B depicts substrate 200 containing ELO thin film stack 250 disposed on or over wafer 208, as described in one embodiment herein. ELO thin film stack 250 may have sacrificial layer 206 disposed on or over wafer 208, epitaxial material 204 disposed on or over sacrificial layer 206, and pre-curved support handle 202 disposed on or over epitaxial material 204. During the etching process, flattened pre-curved support handle 202 bends towards top surface 211, as depicted in FIG. 2C. Pre-curved support handle 202 may have a radius of curvature within a range from about 10 cm to about 100 cm.

In some embodiments, pre-curved support handle 202 contains multiple layers, such as a first layer of wax and a second layer of a polymer disposed on or over the first layer. For example, the second layer may contain polyethylene terephthalate polyester, such as a MYLAR® polymeric film. In other examples, pre-curved support handle 202 contains at least three layers. The third layer may be disposed on or over the second layer. In some examples, the third layer contains another polymer (e.g., polyethylene or derivatives thereof) or wax, which is disposed on or over the second layer.

FIG. 2B depicts substrate 200 containing pre-curved support handle 202 after being flattened. The flattened, pre-curved support handle 202 may be disposed on or over epitaxial material 204, which may be disposed on or over sacrificial layer 206. Sacrificial layer 206 may be disposed on or over wafer 208.

In some embodiments, an adhesive (not shown) may be disposed between pre-curved support handle 202 and epitaxial material 204. The adhesive may be a pressure sensitive adhesive, a hot melt adhesive, an ultraviolet (UV) curing adhesive, a natural adhesive, a synthetic adhesive, derivatives thereof, or combinations thereof.

In some embodiments, sacrificial layer 206 may contain aluminum arsenide, alloys thereof, derivatives thereof, or combinations thereof. In one example, sacrificial layer 206 contains an aluminum arsenide layer. Sacrificial layer 206 may have a thickness of about 20 nm or less, preferably, within a range from about 1 nm to about 10 nm, and more preferably, from about 4 nm to about 6 nm. Wafer 208 may be a wafer or a substrate and usually contains gallium arsenide, gallium arsenide alloys or other derivatives, and may be n-doped or p-doped. In one example, wafer 208 contains n-doped gallium arsenide material. In another example, wafer 208 contains p-doped gallium arsenide material.

In some embodiments, epitaxial material 204 may contain gallium arsenide, aluminum gallium arsenide, indium gallium phosphide, alloys thereof, derivatives thereof, or combinations thereof. Epitaxial material 204 may contain one layer, but usually contains multiple layers. In some examples, epitaxial material 204 contains a layer having gallium arsenide and another layer having aluminum gallium arsenide. In another example, epitaxial material 204 contains a gallium arsenide buffer layer, an aluminum gallium arsenide passivation layer, and a gallium arsenide active layer.

The gallium arsenide buffer layer may have a thickness within a range from about 100 nm to about 500 nm, such as about 300 nm, the aluminum gallium arsenide passivation layer may have a thickness within a range from about 10 nm to about 50 nm, such as about 30 nm, and the gallium arsenide active layer may have a thickness within a range from about 500 nm to about 2,000 nm, such as about 1,000 nm. In some examples, epitaxial material 204 further contains a second aluminum gallium arsenide passivation layer. The second gallium arsenide buffer layer may have a thickness within a range from about 100 nm to about 500 nm, such as about 300 nm.

In other embodiments herein, epitaxial material 204 may have a cell structure containing multiple layers. The cell structure may contain gallium arsenide, n-doped gallium arsenide, p-doped gallium arsenide, aluminum gallium arsenide, n-doped aluminum gallium arsenide, p-doped aluminum gallium arsenide, indium gallium phosphide, alloys thereof, derivatives thereof, or combinations thereof.

Figure 2D:
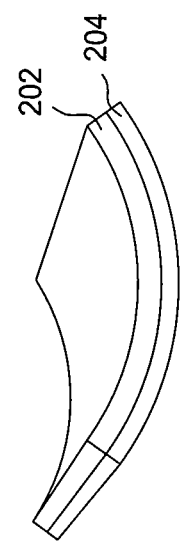
FIG. 2D depicts the pre-curved support handle and an epitaxial material after being removed from the wafer, as described in embodiments herein.

FIG. 2C depicts the formation of etch crevice 210 while sacrificial layer 206 is etched away and pre-curved support handle 202 and the epitaxial material are peeled away from wafer 208 during an ELO etch process, as described in an embodiment herein. FIG. 2D illustrates pre-curved support handle 202 and epitaxial material 204 after being removed from wafer 208. The flattened, pre-curved support handle 202 is under tension while epitaxial material 204 is under compression.

In one embodiment of a method for forming the thin film material, sacrificial layer 206 may be disposed on or over substrate 200, such as wafer 208, epitaxial material 204 disposed on or over sacrificial layer 206, and the flattened, pre-curved support material or handle may be disposed on or over epitaxial material 204. The flattened, pre-curved support material or handle may contain a single layer or multiple layers. The flattened, pre-curved support material or handle may contain wax, polyethylene, polyester, polyolefin, polyethylene terephthalate polyester, rubber, derivatives thereof, or combinations thereof. In some examples, the flattened, pre-curved support handle 202 contains wax. In other examples, the flattened, pre-curved support handle 202 contains polyethylene terephthalate polyester or derivatives thereof, such as a MYLAR® film. In other examples, pre-curved support handle 202 contains polyolefin or derivatives thereof.

In another embodiment, the method for forming the thin film material during an ELO process is provided which includes forming epitaxial material 204 over or on sacrificial layer 206 that is disposed on substrate 200, such as wafer 208. The method further provides adhering or attaching a flattened pre-curved support material, such as pre-curved support handle 202, over or onto epitaxial material 204, wherein the flattened pre-curved support handle 202 is formed by flattening a curved support material, and the flattened pre-curved support handle 202 is under tension while epitaxial material 204 is under compression, removing sacrificial layer 206 during an etching process, and peeling epitaxial material 204 from the substrate while forming the etch crevice therebetween and bending the flattened pre-curved support handle 202 to have substantial curvature.

In some embodiments, sacrificial layer 206 may be exposed to a wet etch solution during an ELO etching process. In some examples, the wet etch solution contains hydrofluoric acid and may contain a surfactant and/or a buffer. Sacrificial layer 206 may be etched at a rate of about 0.3 mm/hr or greater, preferably, about 1 mm/hr or greater, and more preferably, about 5 mm/hr or greater.

In an alternative embodiment, sacrificial layer 206 may be exposed to an electrochemical etch during the ELO etching process. The electrochemical etch may be a biased process or a galvanic process. Also, sacrificial layer 206 may be exposed to a vapor phase etch during the ELO etching process in another embodiment described herein. The vapor phase etch includes exposing sacrificial layer 206 to hydrogen fluoride vapor. The ELO etching process may be a photochemical etch, a thermally enhanced etch, a plasma enhanced etch, a stress enhanced etch, derivatives thereof, or combinations thereof.

Induced-Shrinkage Handle (Universal Shrinkage)

Figure 3B:
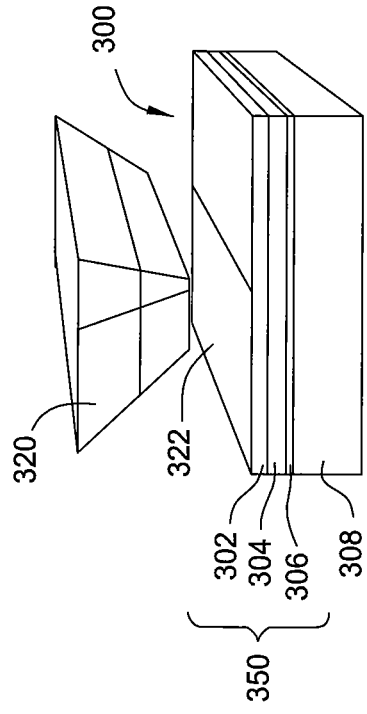
FIGS. 3A-3C depict an ELO thin film stack containing a universal shrinkable support handle according to another embodiment described herein.
Figure 3C:
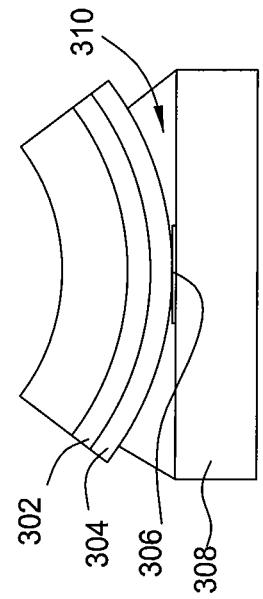
Figure 3A:
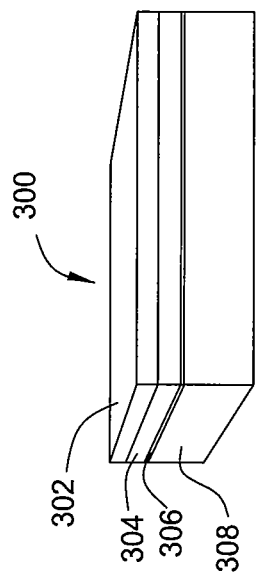

FIGS. 3A-3D depict a universal shrinkable support material or handle during various aspects of an ELO process or within an ELO thin film stack, as described in some embodiments herein. FIG. 3A illustrates substrate 300 containing ELO thin film stack 350 disposed on or over wafer 308, as described in one embodiment herein. ELO thin film stack 350 may include sacrificial layer 306 disposed on or over wafer 308, epitaxial material 304 disposed on or over sacrificial layer 306, and universal shrinkable support handle 302 disposed on or over epitaxial material 304. FIG. 3B depicts force/stress 320 as applied to universal shrinkable support handle 302 provides universal shrinkage 322 across the plain of substrate 300.

Shrinkable support handle 302 contains a universal shrinkable material, such as wax, polyethylene, polyester, polyolefin, polyethylene terephthalate polyester, rubber, derivatives thereof, or combinations thereof. In one example, shrinkable support handle 302 contains wax. In some examples, shrinkable support handle 302 contains polyethylene terephthalate polyester or derivatives thereof, such as a MYLAR® film. In other examples, shrinkable support handle 302 contains polyolefin or derivatives thereof. In other examples, shrinkable support handle 302 contains a first layer having wax and a second layer having a polymer (e.g., polyethylene terephthalate polyester) disposed over the first layer.

Universal shrinkable support handle 302 may contain three layers or more layers. For example, shrinkable support handle 302 further may have a third layer containing wax or a polymer and disposed over the second layer. The third layer may contain polyethylene or derivatives thereof.

Shrinkable support handle 302 contains a bottom surface and a top surface and the bottom surface is adhered to or above epitaxial material 304. Shrinkable support handle 302 bends towards the top surface during the etching process. In another embodiment, the universal shrinkable material contains an amorphous material and the amorphous material may be crystallized to undergo a net volume reduction during the shrinking process. The universal shrinkable material may contain at least one plastic, rubber, polymer, oligomer, derivatives thereof, or combinations thereof. In one specific example, the universal shrinkable material contains polyester or derivatives thereof. In other example, a heat shrinkable adhesive tape may be used as universal shrinkable support handle 302.

In other embodiments, shrinkable support handle 302 may be heated during the shrinking process. Shrinkable support handle 302 may contain a heat shrink plastic or polymer. Alternatively, shrinkable support handle 302 may be shrunk by removing solvent from the shrinkable material. Shrinkable support handle 302 may be bent to have a radius of curvature within a range from about 10 cm to about 100 cm.

In some embodiments, an adhesive (not shown) may be disposed between universal shrinkable support handle 302 and epitaxial material 304. The adhesive may be a pressure sensitive adhesive, a hot melt adhesive, an ultraviolet (UV) curing adhesive, a natural adhesive, a synthetic adhesive, derivatives thereof, or combinations thereof. In some examples, a heat shrinkable tape containing the adhesive on one side may be used as shrinkable support handle 302.

In some embodiments, epitaxial material 304 may contain gallium arsenide, aluminum gallium arsenide, indium gallium phosphide, alloys thereof, derivatives thereof, or combinations thereof. Epitaxial material 304 may contain one layer, but usually contains multiple layers. In some examples, epitaxial material 304 contains a layer having gallium arsenide and another layer having aluminum gallium arsenide. In another example, epitaxial material 304 contains a gallium arsenide buffer layer, an aluminum gallium arsenide passivation layer, and a gallium arsenide active layer.

The gallium arsenide buffer layer may have a thickness within a range from about 100 nm to about 500 nm, such as about 300 nm, the aluminum gallium arsenide passivation layer may have a thickness within a range from about 10 nm to about 50 nm, such as about 30 nm, and the gallium arsenide active layer may have a thickness within a range from about 500 nm to about 2,000 nm, such as about 1,000 nm. In some examples, epitaxial material 304 further contains a second aluminum gallium arsenide passivation layer. The second gallium arsenide buffer layer may have a thickness within a range from about 100 nm to about 500 nm, such as about 300 nm.

In other embodiments herein, epitaxial material 304 may have a cell structure containing multiple layers. The cell structure may contain gallium arsenide, n-doped gallium arsenide, p-doped gallium arsenide, aluminum gallium arsenide, n-doped aluminum gallium arsenide, p-doped aluminum gallium arsenide, indium gallium phosphide, alloys thereof, derivatives thereof, or combinations thereof.

In another embodiment, sacrificial layer 306 may contain aluminum arsenide, alloys thereof, derivatives thereof, or combinations thereof. In one example, sacrificial layer 306 contains an aluminum arsenide layer. Sacrificial layer 306 may have a thickness of about 20 nm or less, preferably, within a range from about 1 nm to about 10 nm, and more preferably, from about 4 nm to about 6 nm. Wafer 308 may be a wafer or a substrate and usually contains gallium arsenide, gallium arsenide alloys, or other derivatives, and may be n-doped or p-doped. In one example, wafer 308 contains n-doped gallium arsenide material. In another example, wafer 308 contains p-doped gallium arsenide material.

Figure 3D:
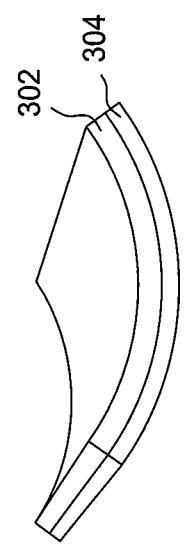
FIG. 3D depicts the universal shrinkable support handle and the epitaxial material after being removed from the wafer, as described in embodiments herein.

FIG. 3C depicts the formation of etch crevice 310 while sacrificial layer 306 is etched away and shrinkable support handle 302 and epitaxial material 304 are peeled away from wafer 308. FIG. 3D illustrates shrinkable support handle 302 and epitaxial material 304 after being removed from wafer 308.

In one embodiment of a method for forming a thin film material during an ELO process, epitaxial material 304 may be formed or deposited over sacrificial layer 306 disposed on or over substrate 300, such as wafer 308, and adhering shrinkable support handle 302 over or onto epitaxial material 304. Shrinkable support handle 302 contains a universal shrinkable material. The method further provides shrinking or reducing the size of shrinkable support handle 302 to form tension in shrinkable support handle 302 and compression in epitaxial material 304 during the shrinking process, removing sacrificial layer 306 during an etching process, and peeling epitaxial material 304 from the substrate while forming etch crevice 310 therebetween and bending shrinkable support handle 302 to have substantial curvature. Shrinkable support handle 302 may contain one layer or multiple layers.

In another embodiment, a method for forming a thin film material during an ELO process is provided which includes positioning substrate 300 containing epitaxial material 304 disposed on or over sacrificial layer 306, which is disposed on or over wafer 308, and adhering shrinkable support handle 302 onto epitaxial material 304. Shrinkable support handle 302 contains a universal shrinkable material. The method further provides shrinking or reducing the size of shrinkable support handle 302 to form tension in shrinkable support handle 302 and compression in epitaxial material 304 during the shrinking process, and removing sacrificial layer 306 during an etching process. The method further provides that the etching process further contains peeling epitaxial material 304 from the substrate, forming etch crevice 310 between epitaxial material 304 from the substrate, and bending shrinkable support handle 302 to have substantial curvature.

In other embodiments, a thin film stack material is provided which includes sacrificial layer 306 disposed on a substrate, epitaxial material 304 disposed over sacrificial layer 306, and shrinkable support handle 302 disposed over epitaxial material 304. Shrinkable support handle 302 contains a universal shrinkable material that upon being shrunk, forms tension in shrinkable support handle 302 and compression in epitaxial material 304. In one example, the shrinkable material contains an amorphous material. The amorphous material may be crystallized to undergo a net volume reduction during the shrinking process. The shrinkable material may contain at least one plastic, polymer, oligomer, derivatives thereof, or combinations thereof. In some examples, shrinkable support handle 302 contains a heat shrink plastic or polymer.

In some embodiments, sacrificial layer 306 may be exposed to a wet etch solution during the etching process. The wet etch solution contains hydrofluoric acid and may contain a surfactant and/or a buffer. In some examples, sacrificial layer 306 may be etched at a rate of about 0.3 mm/hr or greater, preferably, about 1 mm/hr or greater, and more preferably, about 5 mm/hr or greater.

In an alternative embodiment, sacrificial layer 306 may be exposed to an electrochemical etch during the etching process. The electrochemical etch may be a biased process or a galvanic process. Also, sacrificial layer 306 may be exposed to a vapor phase etch during the etching process in another embodiment described herein. The vapor phase etch includes exposing sacrificial layer 306 to hydrogen fluoride vapor. The etching process may be a photochemical etch, a thermally enhanced etch, a plasma enhanced etch, a stress enhanced etch, derivatives thereof, or combinations thereof.

Induced-Shrinkage Handle (Unidirectional Shrinkage)

FIGS. 4A-4D depict a unidirectional shrinkable support material or handle during various aspects of an ELO process or within an ELO thin film stack, as described in one embodiment herein. FIG. 4A illustrates substrate 400 containing ELO thin film stack 450 disposed on or over wafer 408, as described in one embodiment herein. ELO thin film stack 450 may have sacrificial layer 406 disposed on or over wafer 408, epitaxial material 404 disposed on or over sacrificial layer 406, and unidirectional shrinkable support handle 402 disposed on or over epitaxial material 404.

Unidirectional shrinkable support handle 402 contains a shrinkable material and reinforcement fibers extending unidirectional throughout the shrinkable material, which upon being shrunk, shrinks tangential to the reinforcement fibers to form tension in shrinkable support handle 402 and compression in epitaxial material 404. FIG. 4B depicts force/stress 420 as applied to shrinkable support handle 402 provides unidirectional shrinkage 422 across the plain of substrate 400.

Shrinkable support handle 402 contains a bottom surface and a top surface and the bottom surface is adhered to or above epitaxial material 404. Shrinkable support handle 402 may bend towards the top surface during the etching process. In one example, the unidirectional shrinkable material contains an amorphous material, which may be crystallized to undergo a net volume reduction during the unidirectional shrinking process. In another example, the unidirectional shrinkable material may contain plastic, polymer, oligomer, derivatives thereof, or combinations thereof. In one example, the unidirectional shrinkable material contains polyester or derivatives thereof.

The reinforcement fibers may be high-strength polymeric fibers. The reinforcement fibers may contain polyethylene or derivatives thereof. In some examples, the reinforcement fibers contain a negative linear thermal expansion coefficient along the length of the fiber. Generally, the reinforcement fibers have a tensile moduli within a range from about 15 GPa to about 134 GPa.

In some examples, unidirectional shrinkable support handle 402 may be heated during the shrinking process. Shrinkable support handle 402 may contain a heat shrink polymer and high-strength polymeric fibers. In other examples, shrinkable support handle 402 is shrunk by contains removing solvent from the shrinkable material. Shrinkable support handle 402 may be bent to have a radius of curvature within a range from about 10 cm to about 100 cm.

In some embodiments, an adhesive (not shown) may be disposed between unidirectional shrinkable support handle 402 and epitaxial material 404. The adhesive may be a pressure sensitive adhesive, a hot melt adhesive, an ultraviolet (UV) curing adhesive, a natural adhesive, a synthetic adhesive, derivatives thereof, or combinations thereof.

In some embodiments herein, epitaxial material 404 may contain gallium arsenide, aluminum gallium arsenide, indium gallium phosphide, alloys thereof, derivatives thereof, or combinations thereof. Epitaxial material 404 may contain one layer, but usually contains multiple layers. In some examples, epitaxial material 404 contains a layer having gallium arsenide and another layer having aluminum gallium arsenide. In another example, epitaxial material 404 contains a gallium arsenide buffer layer, an aluminum gallium arsenide passivation layer, and a gallium arsenide active layer.

The gallium arsenide buffer layer may have a thickness within a range from about 100 nm to about 500 nm, such as about 400 nm, the aluminum gallium arsenide passivation layer may have a thickness within a range from about 10 nm to about 50 nm, such as about 30 nm, and the gallium arsenide active layer may have a thickness within a range from about 500 nm to about 2,000 nm, such as about 1,000 nm. In some examples, epitaxial material 404 further contains a second aluminum gallium arsenide passivation layer. The second gallium arsenide buffer layer may have a thickness within a range from about 100 nm to about 500 nm, such as about 400 nm.

In other embodiments herein, epitaxial material 404 may have a cell structure containing multiple layers. The cell structure may contain gallium arsenide, n-doped gallium arsenide, p-doped gallium arsenide, aluminum gallium arsenide, n-doped aluminum gallium arsenide, p-doped aluminum gallium arsenide, indium gallium phosphide, alloys thereof, derivatives thereof, or combinations thereof.

In another embodiment, sacrificial layer 406 may contain aluminum arsenide, alloys thereof, derivatives thereof, or combinations thereof. In one example, sacrificial layer 406 contains an aluminum arsenide layer. Sacrificial layer 406 may have a thickness of about 20 nm or less, preferably, within a range from about 1 nm to about 10 nm, and more preferably, from about 4 nm to about 6 nm. Wafer 408 may be a wafer or a substrate and usually contains gallium arsenide, gallium arsenide alloys, or other derivatives, and may be n-doped or p-doped. In one example, wafer 408 contains n-doped gallium arsenide material. In another example, wafer 408 contains p-doped gallium arsenide material.

FIG. 4C depicts the formation of etch crevice 410 while sacrificial layer 406 is etched away and shrinkable support handle 402 and epitaxial material 404 are peeled away from wafer 408. FIG. 4D illustrates shrinkable support handle 402 and epitaxial material 404 after being removed from wafer 408.

In another embodiment, a method for forming a thin film material during an ELO process is provided which includes forming epitaxial material 404 over sacrificial layer 406 on substrate 400, adhering shrinkable support handle 402 onto epitaxial material 404, wherein shrinkable support handle 402 contains a unidirectional shrinkable material and reinforcement fibers extending unidirectional throughout the shrinkable material, and shrinking or reducing shrinkable support handle 402 tangential to the reinforcement fibers to form tension in shrinkable support handle 402 and compression in epitaxial material 404 during the shrinking process. The method further includes removing sacrificial layer 406 during an etching process, and peeling epitaxial material 404 from the substrate while forming an etch crevice therebetween and bending unidirectional shrinkable support handle 402 to have substantial curvature.

In one embodiment of a method for forming a thin film material during an ELO process is provided which includes depositing epitaxial material 404 on or over sacrificial layer 406 that is disposed on wafer 408 of substrate 400, and adhering shrinkable support handle 402 onto epitaxial material 404. Shrinkable support handle 402 contains a unidirectional shrinkable material and reinforcement fibers extending unidirectional throughout the shrinkable material. The method further provides shrinking or reducing shrinkable support handle 402 tangential to the reinforcement fibers to form tension in shrinkable support handle 402 and compression in epitaxial material 404 during the shrinking process, and removing sacrificial layer 406 during an etching process. The etching process contains peeling epitaxial material 404 from the substrate, forming an etch crevice between epitaxial material 404 from the substrate, and bending unidirectional shrinkable support handle 402 to have substantial curvature.

In some embodiments, sacrificial layer 406 may be exposed to a wet etch solution during the etching process. The wet etch solution contains hydrofluoric acid and may contain a surfactant and/or a buffer. In some examples, sacrificial layer 406 may be etched at a rate of about 0.3 mm/hr or greater, preferably, about 1 mm/hr or greater, and more preferably, about 5 mm/hr or greater.

In an alternative embodiment, sacrificial layer 406 may be exposed to an electrochemical etch during the etching process. The electrochemical etch may be a biased process or a galvanic process. Also, sacrificial layer 406 may be exposed to a vapor phase etch during the etching process in another embodiment described herein. The vapor phase etch includes exposing sacrificial layer 406 to hydrogen fluoride vapor. The etching process may be a photochemical etch, a thermally enhanced etch, a plasma enhanced etch, a stress enhanced etch, derivatives thereof, or combinations thereof.

Non-Uniform Handle

Figure 5A:
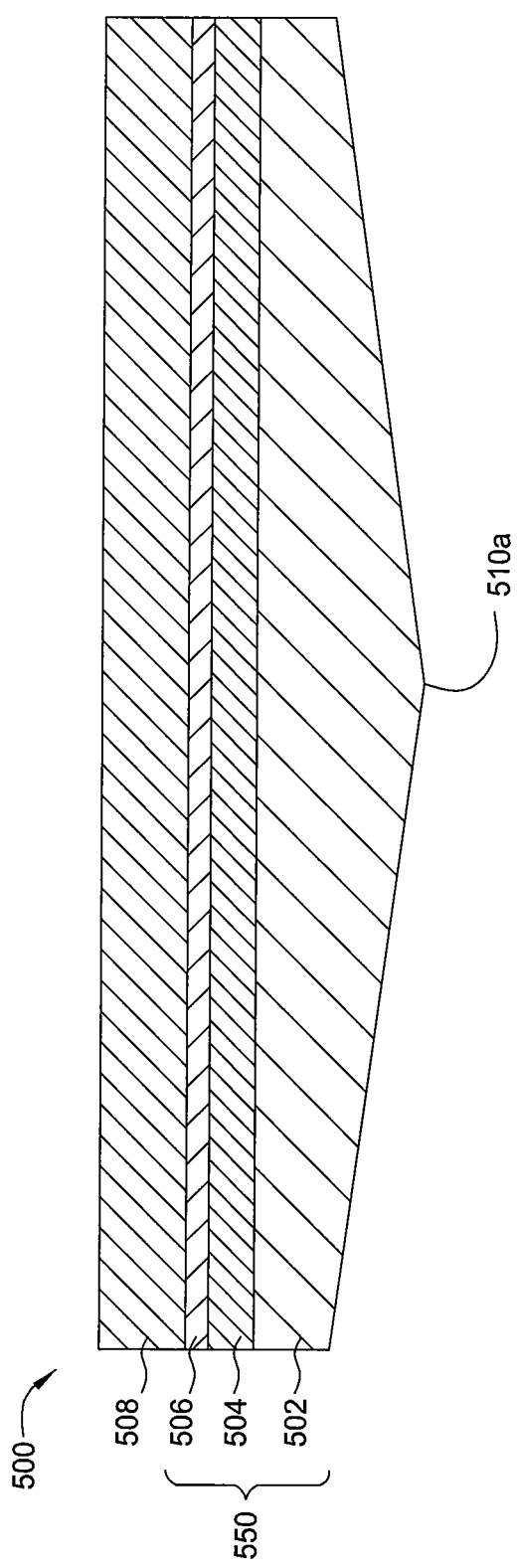
FIGS. 5A-5B depict non-uniform wax support handles disposed on or over a thin film stack according to other embodiments described herein.
Figure 5B:
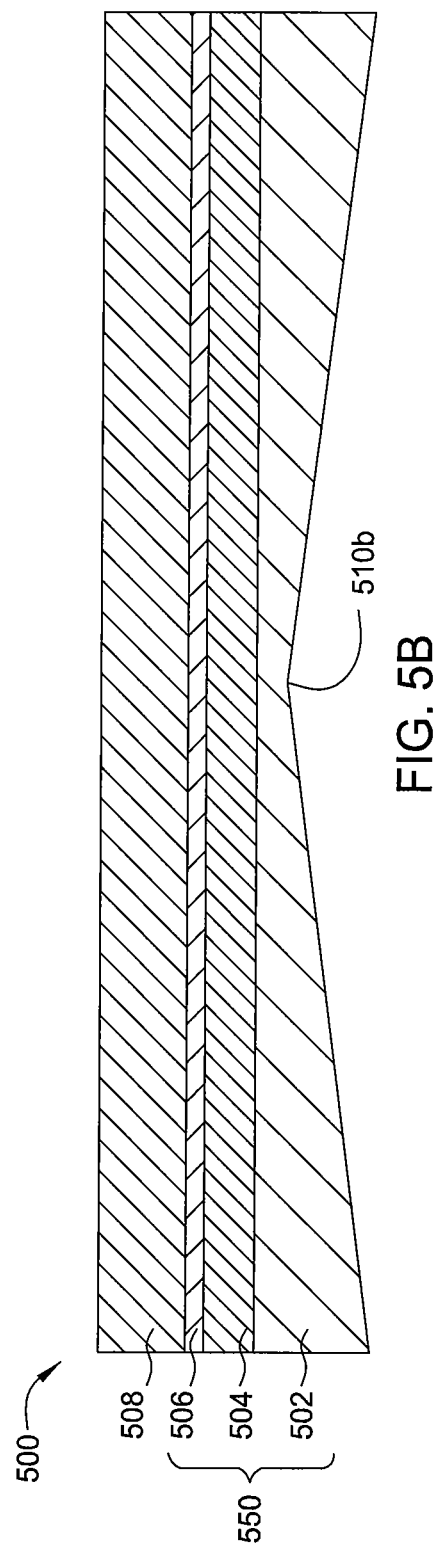

FIGS. 5A-5B depict substrate 500 containing ELO thin film stack 550 disposed on or over wafer 508, as described in one embodiment herein. ELO thin film stack 550 may have sacrificial layer 506 disposed on or over wafer 508, epitaxial material 504 disposed on or over sacrificial layer 506, and non-uniform support handle 502 disposed on or over epitaxial material 504. In one embodiment, non-uniform support handle 502 contains a wax film having a varying thickness, as described in some embodiments herein. In one example, the varying thickness of non-uniform support handle 502 is thickest in or near middle 510a of non-uniform support handle 502, as depicted in FIG. 5A. In another example, the varying thickness of non-uniform support handle 502 is thinnest in or near middle 510b of non-uniform support handle 502, as depicted in FIG. 5B.

In another embodiment, ELO thin film stack 550 contains sacrificial layer 506 disposed on a substrate, epitaxial material 504 under disposed over sacrificial layer 506, and non-uniform support handle 502 disposed over epitaxial material 504, wherein non-uniform support handle 502 contains a wax film having a varying thickness or non-uniform thickness.

In other embodiments, a method for forming a thin film material during an ELO process, is provided which includes forming epitaxial material 504 over sacrificial layer 506 on a substrate, adhering non-uniform support handle 502 onto epitaxial material 504, wherein non-uniform support handle 502 contains a wax film having a varying thickness, removing sacrificial layer 506 during an etching process, and peeling epitaxial material 504 from the substrate while forming an etch crevice therebetween and bending non-uniform support handle 502 to form compression in epitaxial material 504 during the etching process.

In another embodiment, a method for forming a thin film material during an ELO process, is provided which includes positioning a substrate containing epitaxial material 504 disposed over sacrificial layer 506 on the substrate, adhering non-uniform support handle 502 onto epitaxial material 504, wherein non-uniform support handle 502 contains a wax film having a varying thickness, and removing sacrificial layer 506 during an etching process, wherein the etching process further contains peeling epitaxial material 504 from the substrate, forming an etch crevice between epitaxial material 504 from the substrate, and bending non-uniform support handle 502 to form compression in epitaxial material 504 during the etching process.

In some embodiments, non-uniform support handle 502 contains a bottom surface of the wax film and a top surface of a flexible member, and the bottom surface is adhered to epitaxial material 504. Non-uniform support handle 502 may bend towards the top surface. Non-uniform support handle 502 may be bent to have a radius of curvature within a range from about 10 cm to about 100 cm. The flexible member may contain plastic, polymer, oligomer, derivatives thereof, or combinations thereof, for example, polyester or a polyester derivative. The flexible member may have a film thickness within a range from about 50.8 µm (about 20 gauge) to about 127.0 µm (about 500 gauge), preferably, about 23.4 µm (about 92 gauge).

In other examples, the wax film contains wax which has a softening point temperature within a range from about 65° C. to about 95° C., preferably, from about 80° C. to about 90° C., such as about 85° C. In one example, the varying thickness of the wax film is thickest in or near the middle of the wax film (FIG. 5A) or thinnest in or near the middle of the wax film (FIG. 5B). In various embodiments, the varying thickness of the wax film may be within a range from about 1 µm to about 100 µm. In one embodiment, the wax film has a thinnest section having a thickness within a range from about 1 µm to about 25 µm and has a thickest section having a thickness within a range from about 25 µm to about 100 µm.

In some embodiments herein, epitaxial material 504 may contain gallium arsenide, aluminum gallium arsenide, indium gallium phosphide, alloys thereof, derivatives thereof, or combinations thereof. Epitaxial material 504 may contain one layer, but usually contains multiple layers. In some examples, epitaxial material 504 contains a layer having gallium arsenide and another layer having aluminum gallium arsenide. In another example, epitaxial material 504 contains a gallium arsenide buffer layer, an aluminum gallium arsenide passivation layer, and a gallium arsenide active layer.

The gallium arsenide buffer layer may have a thickness within a range from about 100 nm to about 500 nm, such as about 500 nm, the aluminum gallium arsenide passivation layer may have a thickness within a range from about 10 nm to about 50 nm, such as about 30 nm, and the gallium arsenide active layer may have a thickness within a range from about 500 nm to about 2,000 nm, such as about 1,000 nm. In some examples, epitaxial material 504 further contains a second aluminum gallium arsenide passivation layer. The second gallium arsenide buffer layer may have a thickness within a range from about 100 nm to about 500 nm, such as about 500 nm.

In other embodiments herein, epitaxial material 504 may have a cell structure containing multiple layers. The cell structure may contain gallium arsenide, n-doped gallium arsenide, p-doped gallium arsenide, aluminum gallium arsenide, n-doped aluminum gallium arsenide, p-doped aluminum gallium arsenide, indium gallium phosphide, alloys thereof, derivatives thereof, or combinations thereof.

In another embodiment, sacrificial layer 506 may contain aluminum arsenide, alloys thereof, derivatives thereof, or combinations thereof. In one example, sacrificial layer 506 contains an aluminum arsenide layer. Sacrificial layer 506 may have a thickness of about 20 nm or less, preferably, within a range from about 1 nm to about 10 nm, and more preferably, from about 4 nm to about 6 nm. Wafer 508 may be a wafer or a substrate and usually contains gallium arsenide, gallium arsenide alloys, or other derivatives, and may be n-doped or p-doped. In one example, wafer 508 contains n-doped gallium arsenide material. In another example, wafer 508 contains p-doped gallium arsenide material.

In some embodiments, sacrificial layer 506 may be exposed to a wet etch solution during the etching process. The wet etch solution contains hydrofluoric acid and may contain a surfactant and/or a buffer. In some examples, sacrificial layer 506 may be etched at a rate of about 0.3 mm/hr or greater, preferably, about 1 mm/hr or greater, and more preferably, about 5 mm/hr or greater.

In an alternative embodiment, sacrificial layer 506 may be exposed to an electrochemical etch during the etching process. The electrochemical etch may be a biased process or a galvanic process. Also, sacrificial layer 506 may be exposed to a vapor phase etch during the etching process in another embodiment described herein. The vapor phase etch includes exposing sacrificial layer 506 to hydrogen fluoride vapor. The etching process may be a photochemical etch, a thermally enhanced etch, a plasma enhanced etch, a stress enhanced etch, derivatives thereof, or combinations thereof.

Multi-Layered Support Handle

Embodiments of the invention generally relate to ELO thin film materials and devices and methods used to form such materials and devices. In one embodiment, a method for forming a thin film material during an ELO process is provided which includes depositing or otherwise forming an epitaxial material over a sacrificial layer on a substrate, adhering a support handle onto the epitaxial material, removing the sacrificial layer during an etching process, and peeling the epitaxial material from the substrate while forming an etch crevice therebetween while maintaining compression in the epitaxial material during the etching process. The method further provides that the support handle contains a stiff support layer adhered to the epitaxial material, a soft support layer adhered to the stiff support layer, and a handle plate adhered to the soft support layer.

Figure 6A:
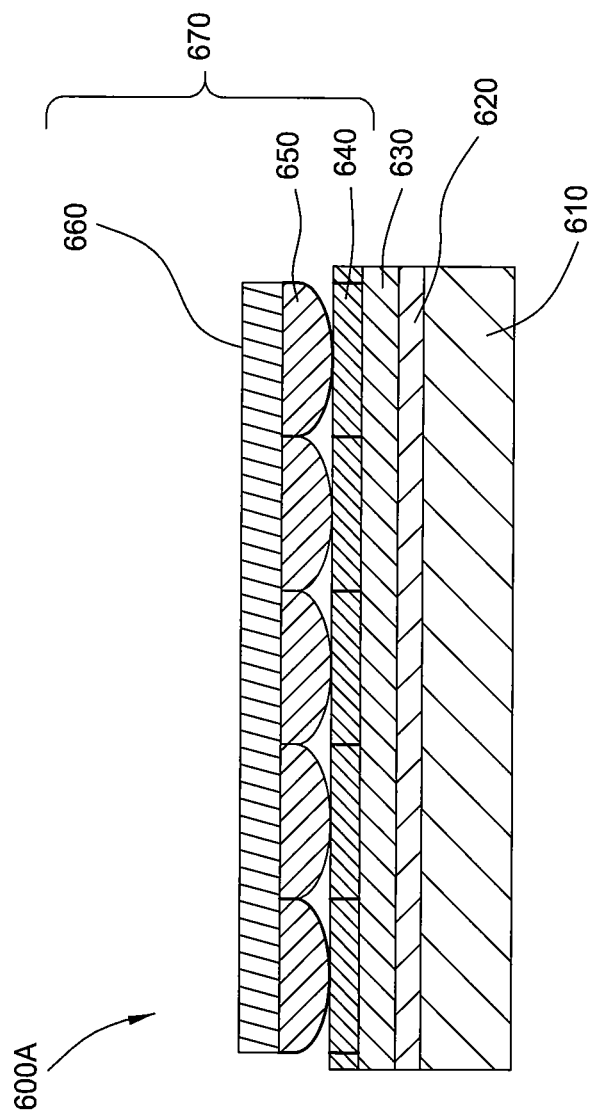
FIG. 6A depict a multi-layered support handle disposed over a thin film stack on a substrate according to another embodiment described herein.

In one embodiment, as depicted in FIG. 6A, ELO thin film stack 600A is provided which includes sacrificial layer 620 disposed on or over a substrate, such as wafer 610, epitaxial material 630 disposed on or over sacrificial layer 620, and multi-layered support handle 670 disposed on or over epitaxial material 630. In one example, multi-layered support handle 670 contains stiff support layer 640 disposed over epitaxial material 630, soft support layer 650 disposed over stiff support layer 640, and handle plate 660 disposed over soft support layer 650. Multi-layered support handle 670 is disposed on and maintains compression of epitaxial material 630.

In some examples, stiff support layer 640 may contain a polymer, a copolymer, an oligomer, derivatives thereof, or combinations thereof. In one embodiment, stiff support layer 640 contains a copolymer. In one example, the copolymer may be an ethylene/vinylacetate (EVA) copolymer or derivatives thereof. An EVA copolymer which is useful as stiff support layer 640 is WAFER GRIP adhesive film, commercially available from Dynatex International, located in Santa Rosa, Calif. In other examples, stiff support layer 640 may contain a hot-melt adhesive, an organic material or organic coating, an inorganic material, or combinations thereof.

In one embodiment, stiff support layer 640 contains an inorganic material having multiple inorganic layers, such as metal layers, dielectric layers, or combinations thereof. In another example, stiff support layer 640 may contain composite materials or patterned composite materials, such as organic/inorganic materials. The composite materials may contain at least one organic material and at least one inorganic material. In some examples, the inorganic material may contain a metal layer, a dielectric layer, or combinations thereof. A composite material may be used to optimize device performance, such as an increase in reflectivity, conductivity, and/or yield. In another embodiment, stiff support layer 640 may contain wax or derivatives thereof, such as black wax.

In another embodiment, soft support layer 650 may contain an elastomer, such as rubber, foam, or derivatives thereof. Alternatively, soft support layer 650 may contain a material such as neoprene, latex, or derivatives thereof. Soft support layer 650 may contain a monomer. For example, soft support layer 650 may contain an ethylene propylene diene monomer or derivatives thereof.

In another embodiment, soft support layer 650 may contain a liquid or a fluid contained within a membrane. Alternatively, soft support layer 650 may contain a gas contained within a membrane. The membrane may contain a material such as rubber, foam, neoprene, latex, or derivatives thereof. In one example, the membrane is a balloon of rubber or latex.

In another embodiment, handle plate 660 may contain a material such as plastic, polymer, oligomer, derivatives thereof, or combinations thereof. In one example, handle plate 660 may contain polyester or derivatives thereof. Handle plate 660 may have a thickness within a range from about 50.8 μm to about 127.0 μm, such as about 23.4 μm.

Figure 6B:
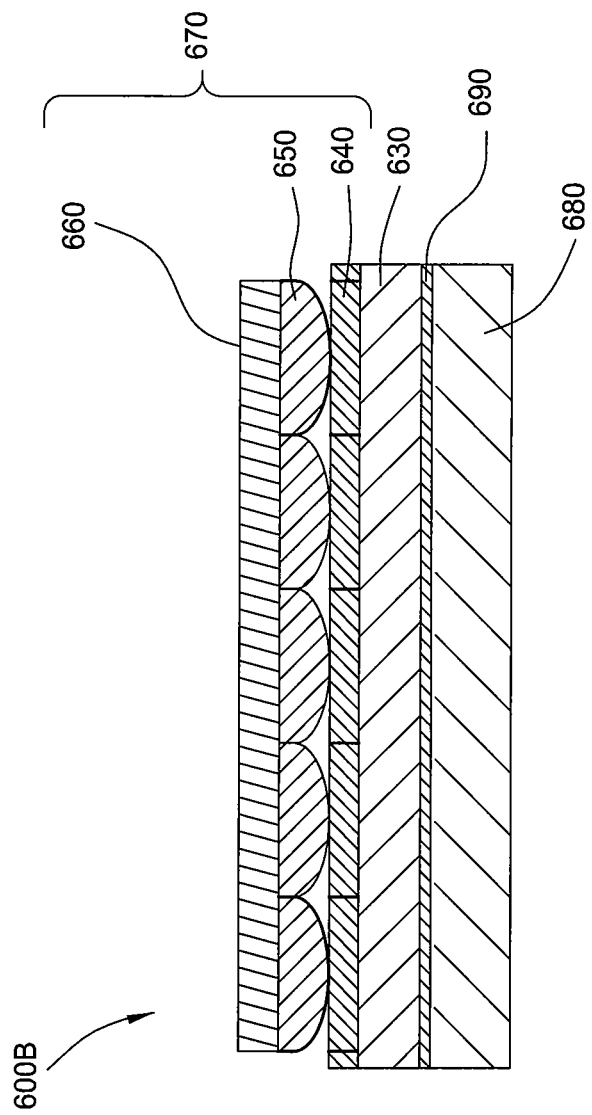
FIG. 6B depict the multi-layered support handle and the thin film stack disposed on a support substrate according to another embodiment described herein.

In one embodiment, the method further includes removing sacrificial layer 620 to separate epitaxial material 630 from the substrate, such as wafer 610, as depicted in FIG. 6A, and subsequently adhering or attaching epitaxial material 630 to support substrate 680 by bonding therebetween with an adhesive to form adhesive layer 690, as depicted in FIG. 6B. Support substrate 680 may be bonded to an exposed surface of epitaxial material 630 by the adhesive. In one example, adhesive layer 690 may be formed from or contain an optical adhesive and/or a UV-curable, such as commercially available as Norland UV-curable optical adhesive. In some examples, the adhesive may contain a mercapto ester compound. In other examples, the adhesive may further contain a material such as butyl octyl phthalate, tetrahydrofurfuryl methacrylate, acrylate monomer, derivatives thereof, or combinations thereof.

In one example, as depicted in FIG. 6B, ELO thin film stack 600B is provided which includes support substrate 680 disposed over a first surface of epitaxial material 630, and multi-layered support handle 670 disposed over the other surface of epitaxial material 630. Adhesive layer 690 may be disposed between epitaxial material 630 and support substrate 680. Multi-layered support handle 670 contains stiff support layer 640 disposed over epitaxial material 630, soft support layer 650 disposed over stiff support layer 640, and handle plate 660 disposed over soft support layer 640.

In one example, adhesive layer 690 may be formed from adhesive that has been exposed to UV radiation during a curing process. Generally, the adhesive may be exposed to the UV radiation for a time period within a range from about 1 minute to about 10 minutes, preferably, from about 3 minutes to about 7 minutes, such as about 5 minutes. The adhesive may be cured at a temperature within a range from about 25° C. to about 75° C., such as about 50° C.

In other examples, the adhesive of adhesive layer 690 may be a silicone adhesive or may contain sodium silicate. In these examples, the adhesive may be cured for a time period within a range from about 10 hours to about 100 hours, preferably, from about 20 hours to about 60 hours, and more preferably, from about 30 hours to about 50 hours, for example, about 42 hours. The adhesive may be cured at a temperature within a range from about 25° C. to about 75° C., such as about 50° C. Also the adhesive may be cured at a pressure within a range from about 1 psi (pounds per square inch) to about 50 psi, preferably, from about 3 psi to about 25 psi, and more preferably, from about 5 psi to about 15 psi. In one example, the pressure may be about 9 psi.

Sacrificial layer 620 may be exposed to an etching process to remove epitaxial material 630 from the substrate. In some embodiments, sacrificial layer 620 may be exposed to a wet etch solution during the etching process. The wet etch solution contains hydrofluoric acid and may contain a surfactant and/or a buffer. In some examples, sacrificial layer 620 may be etched at a rate of about 0.3 mm/hr or greater, preferably, about 1 mm/hr or greater, and more preferably, about 5 mm/hr or greater. In an alternative embodiment, sacrificial layer 620 may be exposed to an electrochemical etch during the etching process. The electrochemical etch may be a biased process or a galvanic process. Also, sacrificial layer 620 may be exposed to a vapor phase etch during the etching process in another embodiment described herein. The vapor phase etch includes exposing sacrificial layer 620 to hydrogen fluoride vapor. The etching process may be a photochemical etch, a thermally enhanced etch, a plasma enhanced etch, a stress enhanced etch, derivatives thereof, or combinations thereof.

In embodiments herein, epitaxial material 630 may contain gallium arsenide, aluminum gallium arsenide, indium gallium phosphide, alloys thereof, derivatives thereof, or combinations thereof. Epitaxial material 630 may have a rectangular geometry, a square geometry, or other geometries. Epitaxial material 630 may contain one layer, but usually contains multiple layers. In some examples, epitaxial material 630 contains a layer having gallium arsenide and another layer having aluminum gallium arsenide. In another example, epitaxial material 630 contains a gallium arsenide buffer layer, an aluminum gallium arsenide passivation layer, and a gallium arsenide active layer. The gallium arsenide buffer layer may have a thickness within a range from about 100 nm to about 500 nm, such as about 300 nm, the aluminum gallium arsenide passivation layer has a thickness within a range from about 10 nm to about 50 nm, such as about 30 nm, and the gallium arsenide active layer has a thickness within a range from about 500 nm to about 2,000 nm, such as about 1,000 nm. In some examples, epitaxial material 630 further contains a second aluminum gallium arsenide passivation layer.

In other embodiments herein, epitaxial material 630 may contain a cell structure containing multiple layers. The cell structure may contain gallium arsenide, n-doped gallium arsenide, p-doped gallium arsenide, aluminum gallium arsenide, n-doped aluminum gallium arsenide, p-doped aluminum gallium arsenide, indium gallium phosphide, alloys thereof, derivatives thereof, or combinations thereof. In many examples, the gallium arsenide is n-doped or p-doped.

In some embodiments, sacrificial layer 620 may contain aluminum arsenide, alloys thereof, derivatives thereof, or combinations thereof. In one example, sacrificial layer 620 contains an aluminum arsenide layer and has a thickness of about 20 nm or less, preferably, within a range from about 1 nm to about 10 nm, and more preferably, from about 4 nm to about 6 nm. The substrates, such as wafer 610 and/or support substrate 680, usually contain gallium arsenide or derivatives thereof, and may be n-doped or p-doped.

While the foregoing is directed to embodiments of the invention, other and further embodiments of the invention may be devised without departing from the basic scope thereof, and the scope thereof is determined by the claims that follow.

The invention claimed is:

1. A thin film stack material for at least one device selected from a group consisting of a solar device, a semiconductor device, and an electronic device, said thin film stack material comprising:
   a sacrificial layer disposed on a substrate;
   an epitaxial material disposed over the sacrificial layer;
   a pre-curved support material configured to be flattened; and
   a flattened, pre-curved support handle comprising the pre-curved support material disposed over the epitaxial material, wherein the flattened, pre-curved support handle is under tension while the epitaxial material is under compression, and wherein said flattened, pre-curved support handle is operable to bend said epitaxial material responsive to an etching of said sacrificial layer.

2. The thin film stack material of claim 1, wherein the flattened, pre-curved support handle comprises a material selected from the group consisting of wax, polyethylene, polyester, polyolefin, polyethylene terephthalate polyester, rubber, derivatives thereof, and combinations thereof.

3. The thin film stack material of claim 1, wherein the flattened, pre-curved support handle comprises a first layer comprising wax and a second layer comprising a polymer disposed over the first layer.

4. The thin film stack material of claim 1, wherein an adhesive is disposed between the flattened, pre-curved support handle and the epitaxial material, and the adhesive is selected from the group consisting of pressure sensitive adhesive, hot melt adhesive, UV curing adhesive, natural adhesive, synthetic adhesive, derivatives thereof, and combinations thereof.

5. The thin film stack material of claim 4, wherein the epitaxial material comprises a material selected from the group consisting of gallium arsenide, aluminum gallium arsenide, indium gallium phosphide, alloys thereof, derivatives thereof, and combinations thereof.

6. The thin film stack material of claim 1, wherein the epitaxial material comprises a cell structure containing multiple layers comprising at least one material selected from the group consisting of gallium arsenide, n-doped gallium arsenide, p-doped gallium arsenide, aluminum gallium arsenide, n-doped aluminum gallium arsenide, p-doped aluminum gallium arsenide, indium gallium phosphide, alloys thereof, derivatives thereof, and combinations thereof.

7. The thin film stack material of claim 1, wherein the sacrificial layer comprises a material selected from the group consisting of aluminum arsenide, alloys thereof, derivatives thereof, and combinations thereof.

8. The thin film stack material of claim 1, wherein the substrate comprises gallium arsenide, n-doped gallium arsenide, p-doped gallium arsenide, or derivatives thereof.

* * * * *